United States Patent
Sato et al.

(10) Patent No.: US 8,544,713 B2
(45) Date of Patent: Oct. 1, 2013

(54) APPARATUS AND METHOD OF COATING FLUX

(75) Inventors: Issaku Sato, Tokyo (JP); Akira Takaguchi, Toyama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 12/646,777

(22) Filed: Dec. 23, 2009

(65) Prior Publication Data

US 2010/0163606 A1  Jul. 1, 2010

(30) Foreign Application Priority Data

Dec. 27, 2008  (JP) ................................. 2008-335441

(51) Int. Cl.
 *B23K 1/20*  (2006.01)
(52) U.S. Cl.
 USPC ............................... 228/40; 228/33; 228/223
(58) Field of Classification Search
 USPC ...................................... 228/233, 33, 40, 223
 See application file for complete search history.

(56) References Cited

U.S. PATENT DOCUMENTS 5,560,534 A  10/1996  Okada et al.

FOREIGN PATENT DOCUMENTS

| JP | 55088978 A | 7/1980 |
|---|---|---|
| JP | 56060669 A * | 5/1981 |
| JP | 02112876 A | 4/1990 |
| JP | 07-263856 | 10/1995 |
| JP | 09097972 A | 4/1997 |
| JP | 10022618 A | 1/1998 |
| JP | 11177226 A | 7/1999 |
| JP | 2000013007 A | 1/2000 |
| JP | 2000-049448 | 2/2000 |
| JP | 2002290024 A | 10/2002 |
| JP | 2002368401 A | 12/2002 |
| JP | 2003124621 A | 4/2003 |
| JP | 2003179336 A | 6/2003 |
| JP | 2005-262247 | 9/2005 |
| JP | 2006-263564 | 5/2006 |
| JP | 2008177437 A | 7/2008 |

OTHER PUBLICATIONS

Jeggy, Thierry, European Search Report for EP 09252890, Mar. 26, 2010, Munich.
Notification of Reasons for Refusal for Japanese Patent Application No. 2008-335441, mailed Oct. 23, 2012.

* cited by examiner

*Primary Examiner* — Nicholas P D'Aniello
(74) *Attorney, Agent, or Firm* — Chernoff Vilhauer McClung & Stenzel LLP

(57) ABSTRACT

An apparatus coats flux on a projection of a part mounted on a printed circuit board. The projection passes through the printed circuit board and projects from the printed circuit board. The apparatus contains a printed-circuit-board-holding member that holds the printed circuit board, a nozzle having an opening through which the projection comes in the nozzle and comes off the nozzle, a nozzle-moving member that moves the nozzle to a predetermined position, and a flux-supplying member that supplies the flux to the nozzle. The flux is coated on at least the projection by dipping the projection in the flux contained in the nozzle through the opening.

2 Claims, 10 Drawing Sheets

APPARATUS AND METHOD OF COATING FLUX

CROSS REFERENCE TO RELATED APPLICATION

The present invention contains subject matter related to Japanese Patent Application JP 2008-335441 filed in the Japanese Patent Office on Dec. 27, 2008, the entire contents of which being incorporated herein by reference.

BACKGROUND OF THE INVENTION

1. Field of the Invention

The present invention relates to an apparatus and a method of coating flux. It particularly relates to an apparatus and a method of coating flux on a printed circuit board pinpointing at only necessary point(s) for local soldering.

2. Description of Related Art

The printed circuit board has formerly been soldered by a flow soldering in an automatic soldering apparatus having a soldering bath in which rod-like solder or line-like solder is melted on several reasons such that equipment for the flow soldering is inexpensive costly even if peripheral equipment is included, the flow soldering has high reliability as the soldering and parts for the flow soldering is easily available because parts with a lead wire is easily manufactured.

In recent years, the soldering method has shifted from the flow soldering to a reflow soldering that is suitable for the soldering of small surface mount device as a demand to use any small electronic equipment rises according to popularity of portable equipment. In the reflow soldering, the surface mount device passes through a reflow oven having heated temperature of 220° C. through 250° C. for a period of time of one minute or more so that any higher heat-resisting property is necessary for the surface mount device for the reflow soldering compared with that of any past device for the flow soldering. Further, as solder used for the soldering, past Sn—Pb solder with a melting temperature of 183° C. has been recently replaced with lead-free solder, for example, Sn—$_{3.0mass\%}$Ag—$_{0.5mass\%}$Cu, having a melting temperature of 220° C., which also may require an electronic parts having any higher heat-resisting property, in order to counter an environmental issue.

Thus, the shift of the soldering method from the flow soldering to the reflow soldering or the replacement of the past Sn—Pb solder with the lead-free solder has been facilitated. There are, however, many electronic parts having no structure-based heat-resisting property that may be necessary for these soldering methods. For example, precision semiconductor such as a micro processor unit (MPU), a connection part such as a connecter and a switch in which the exterior thereof is plastic, or aluminum electrolytic condenser containing electrolyte therein is illustrated. Many parts thereof presently may have been retrofitted by using a soldering iron, a partial flow soldering apparatus or the like.

In the soldering of the partial flow soldering apparatus, when the flux is coated on a whole of a surface to be soldered of the printed circuit board, it is necessary to clean the flux coated on any unnecessary portions, which causes a manufacture cost to be increased. When the flux is inserted into a loading slot of a jack of a connecter mounted on the surface to be soldered of the printed circuit board, it may become impossible as the connecter. This results in a case where the flux is coated on only any necessary portions. Therefore, the flux is coated manually or by using the partial flow soldering apparatus that can coat the flux on only any necessary portions.

Such a manual flux coating reduces operating efficiency because a human do so. Further, its results are dependent on some experience of a person who executes the manual flux coating so that skilled labor may be required. Such skilled labor is not easy to be trained.

An apparatus of coating the flux, which has been formerly used to coat the flux efficiently on only the necessary portions, is a foaming typed apparatus of coating the flux. Namely, the flux is foamed from a surface of porous hollow material contained in the nozzle by supplying air into the porous hollow material and the nozzle supplies the foamed flux that has been inflated by the foaming upward to coat it on a part to be partially soldered of the printed circuit board and a lead wire. Such a foaming typed apparatus of coating the flux, however, may require any maintenance such that the flux is foamed in a solvent in order to prevent the porous hollow material from being clogged by the foamed flux. Further, a diluent is used in order to control a specific gravity of the solvent, thereby increasing the manufacturing cost.

The apparatus of coating the flux contains a spray typed apparatus of coating the flux other than the foaming typed apparatus of coating the flux. Japanese Patent Application Publication NO. H02-112876 has disclosed an invention in which the flux is coated on a printed circuit board through an opening of a palette using the spray typed apparatus of coating the flux.

Japanese Patent Application Publication NO. H11-177226 has disclosed an invention in which a mask nozzle having an opening which is almost the same shape as that of a group of parts to be soldered of a printed circuit board is used in order to coat the flux on only the group of parts to be soldered of the printed circuit board as a method of coating the flux partially on the printed circuit board.

Japanese Patent Application Publication NOS. H10-22618, 2003-124621 and 2003-179336 have respectively disclosed inventions relating to spray typed apparatuses and methods of coating the flux in each of which an outlet is provided near a nozzle in order to discharge excessive flux.

Japanese Patent Application Publication NO. 2002-290024 has disclosed an invention relating to a method of dipping a part to be soldered of a printed circuit board directly into flux. Specifically, the part to be soldered of the printed circuit board is dipped into liquid that is made by diluting a flux solution with volatile solvent.

Japanese Patent Application Publication No. 2008-177437 has disclosed an invention relating to a method of coating flux in which a lead pin is provided with recesses that hold a necessary amount of flux. In this invention, an amount of flux that is necessary for soldering is previously calculated. The lead pin is provided with recesses that have volume of holding a calculated amount of flux. Next, the lead pin with the recesses is dipped into the flux to hold the flux on the recesses.

Japanese Patent Application Publication NO. 2002-368401 has disclosed an invention relating to a method of coating flux utilizing capillary phenomenon. In this invention, a container filled with flux is provided with penetration members and by utilizing the capillary phenomenon, the flux is penetrated to the penetration members. The flux is coated on the printed circuit board by contacting the penetration members with a part to be soldered of the printed circuit board.

Japanese Patent Application Publication NO. 2000-13007 has disclosed an invention relating to a method of coating flux by utilizing the capillary phenomenon under the pressure of gas. In this invention, a container containing the flux is provided with small holes at positions corresponding to parts of a printed circuit board, on which the flux is to be coated, and then this container is inclined or the flux is flown into or out of the container so that the flux is adhered to an interior of each of the small holes. The flux is coated on the printed circuit board by flowing gas into the container from a gas inlet pipe connecting the container. Alternatively, flux-solution-sending pipes connect the small holes and forward ends of the flux-solution-sending pipes connect the printed circuit board or come close to the printed circuit board. Next, by supplying gas from the gas inlet pipe, the flux is coated on the printed circuit board.

SUMMARY OF THE INVENTION

However, the apparatus of coating the flux, which is disclosed in Japanese Patent Application Publication NO. H02-112876 may leak the flux according to a configuration of the pallet because the flux is coated using the pallet.

The apparatus of coating the flux, which is disclosed in Japanese Patent Application Publication NO. H11-177226 is provided with a spray nozzle at a lower position of the mask nozzle which has a simple shape such as a cylinder shape or a rectangular tube shape solely for enclosing a part to be locally soldered of the printed circuit board or a group of parts to be soldered of the printed circuit board. When this apparatus of coating the flux coats the flux on the printed circuit board, the mask nozzle mounts the printed circuit board with the mask nozzle aligning, for example, the group of parts to be soldered of the printed circuit board and then, the spray nozzle sprays the misty flux from the lower position of the mask nozzle to coat the flux on, for example, the group of parts to be soldered of the printed circuit board. This apparatus of coating the flux, however, has an opening which is almost the same shape as that of, for example, the group of parts to be soldered of the printed circuit board but in the mask nozzle, air is not escaped therefrom. Air pressure therein thus rises so that a gap may occur between a forward end of the mask nozzle and an installed surface of the printed circuit board, thereby causing the misty flux to blow therefrom.

While the leakage of the flux is improved by reforming the configuration of the mask nozzle or providing an outlet near the nozzle as the apparatuses and methods of coating the flux, which are disclosed in Japanese Patent Application Publication NOS. H10-22618, 2003-124621 and 2003-179336, it is difficult to coat the flux sufficiently into a through-hole of the printed circuit board by such apparatuses and methods of coating the flux if the printed circuit board is a through-hole-printed circuit board or the through-hole exists in a position where there is large thermal capacity. For example, if the through-hole-printed circuit board has a thickness of 1.2 mm or more, particularly, 3 through 5 mm, it is very difficult to coat the flux sufficiently into an interior of the through-hole by such apparatuses and methods of coating the flux. As a result thereof, less solderability or solder wettability occurs in the through-hole, which may cause defective soldering.

By the spray typed apparatus of coating the flux, it is generally difficult to coat the flux into an interior of the through-hole of the printed circuit board.

While the part to be soldered of the printed circuit board is directly dipped into the flux in the apparatus and method of coating the flux, which is disclosed in Japanese Patent Application Publication NO. 2002-290024, a part of the printed circuit board, to which the flux is coated, is limited to a lead wire of a part or the like. It is thus difficult to coat the flux sufficiently into the through-hole and/or a land of the printed circuit board. This prevents an amount of flux to be coated into an interior of the through-hole and the land from being maintained sufficiently, which may cause defective soldering.

Further, the operations are complicated because parts are inserted into the printed circuit board after the flux has been coated by dipping. In order to execute the invention disclosed in Japanese Patent Application Publication NO. 2002-290024, an apparatus for supplementing solvent may be required because a density of the flux varies based on the dipping step, which causes high manufacturer's cost.

In the method of coating the flux, which is disclosed in Japanese Patent Application Publication No. 2008-177437, the amount of flux that is necessary for soldering is calculated and a lead pin is provided with recesses that hold such amount of flux. This causes the operations for providing the recesses to be complicated, which causes high manufacturer's cost. Similar to the invention disclosed in Japanese Patent Application Publication NO. 2002-290024, the flux can be coated on the lead pin but it is difficult to coat the flux into an interior of the through-hole and/or a land of the printed circuit board, which may cause defective soldering at these portions.

While the apparatus and method of coating the flux, which is disclosed in Japanese Patent Application Publication NO. 2002-368401, is suitable for coating the flux on the printed circuit board at the same level, a lead portion of each of the parts may interfere any penetration members when the flux is coated with the parts being mounted through the through-holes. This prevents the flux from being coated so that it is difficult to coat the flux thereon sufficiently, and to coat the necessary amount of flux locally on a necessary portion reliably.

While an apparatus of coating flux, which is disclosed in Japanese Patent Application Publication NO. 2000-13007, may require any delicate design for the small holes in order to avoid scattering the flux on unnecessary portion, which causes a lot of elapsed time and high manufacturer's cost. When an amount of the flux to be coated varies, a depth of each of the small holes or a depth of each of the small holes in a flux-supplying plate separately provided also varies. This results in a case where a design of the apparatus of coating the flux may vary each time when the parts to be soldered and the printed circuit board are changed.

In this apparatus of coating the flux, there is no mechanism for removing excessive flux after the flux has been coated on the printed circuit board by spraying the flux based on air pressure so that the excessive flux is adhered. This may cause the flux to be penetrated and inserted into an interior of switch component when soldering. The small holes are subject to the clogging of solid contents of the flux, which may require any effort for maintenance.

Further, since the gaseous flux is coated in this apparatus of coating the flux, it is difficult to adjust an amount of the flux to be coated.

It is desirable to provide an apparatus and a method of coating a necessary amount of the flux certainly on the printed circuit board for partially soldering and pinpointing at only closely limited point(s), for example, one lead wire, without penetrating and leaking the flux.

According to an embodiment of the invention, there is provided an apparatus of coating flux on a projection of a part mounted on a printed circuit board. The projection passes through the printed circuit board and projects from the printed circuit board. The apparatus contains a printed-circuit-board-holding member that holds the printed circuit board, a nozzle having an opening through which the projection comes in the nozzle and comes off the nozzle, a nozzle-moving member that moves the nozzle to a predetermined position and a flux-supplying member that supplies the flux to the nozzle.

Here, the terms, "supply the flux to the nozzle" basically mean filling the whole of an interior of the nozzle with the flux. The terms also mean filling the nozzle with the flux to slightly above a forward end of the nozzle by surface tension when the whole of the interior of the nozzle is filled with the flux.

In this embodiment, the printed-circuit-board-holding member holds the printed circuit board. The nozzle having an opening through which the projection comes in the nozzle and comes off the nozzle moves by the nozzle-moving member to a predetermined position. When the nozzle moves to the predetermined position of the printed circuit board, the flux-supplying member supplies the flux to the nozzle.

The flux is coated on at least the projection by dipping the projection in the flux contained in the nozzle through the opening. In this case, the terms, "supply the flux to the nozzle" mean filling an interior of the nozzle with the flux up to a level such that the flux can be coated on the projection by the capillary phenomenon, which will be described, not exactly filling the whole of an interior of the nozzle with the flux. Here, the term, "dipping" includes coating the flux on the projection by the capillary phenomenon when the projection contracts the flux just a little.

Further, the flux-supplying member may supply the flux to push the flux just a bit out of the opening of the nozzle. This allows the flux to be coated on the projection and particularly, the through-hole, much more surely. In this case, the terms, "supply the flux to the nozzle" mean filling the nozzle with the flux to a level such that the projection does not contact the flux, in addition to the above-mentioned meanings, because the flux is pushed so that the projection is not required to contact the flux.

In this embodiment, the flux-supplying member may have a mechanism for lowering a level of a surface of the flux filled in the interior of the nozzle after the flux has been coated on the projection. This enables the flux excessively adhered to the projection and the land of the printed circuit board to be removed. Here, the terms, "lowering a level of a surface of the flux" mean not only lowering a level of a surface of the flux to a degree such that a forward end of the projection separates perfectly from the flux, as shown in FIG. 13, but also lowering a level of a surface of the flux to a degree such that the forward end of the projection slightly contact the flux. Such a mechanism for lowering a level of a surface of the flux is also realized by lifting the printed circuit board so that the projection is lifted.

In this embodiment, the flux-supplying member may contain a supply portion that includes a cylinder having a flux-accumulating part which accumulates the flux temporarily and supplies the flux to the nozzle, a flux-storage portion that stores the flux and supplies the flux to the supply portion, and a control portion that controls the supply portion to supply an amount of the flux to an interior of the nozzle. If necessary, the supply portion may contain a cylinder also having a solvent-accumulating part which accumulates a solvent and is adjacent to the flux-accumulating part across a piston. Further, by providing a solvent storage portion that stores a solvent for preventing the flux from adhering and supplies the solvent to the above-mentioned solvent-accumulating part, it is possible to prevent the piston from adhering by the flux in the cylinder to improve the slide of the piston in the cylinder. As the solvent, for example, isopropyl alcohol is used.

In this embodiment, the flux-supplying member further may contain a pipe that connects the nozzle and the flux-accumulating part and a switching mechanism that switches the supply of the flux from the flux-storage portion to the flux-accumulating part or from the flux-accumulating part to the nozzle. The switching mechanism is provided on the pipe.

The embodiment of the apparatus of coating the flux according to the invention may have a driving source for the piston of the supply portion. The driving source includes a motor that can control an amount of revolution, for example, a servomotor or a stepping (pulse) motor.

In the embodiment of the apparatus of coating the flux according to the invention, the control portion may control the driving of such a motor to move the piston and may set an amount of the flux to be supplied, a period of time when the flux is supplied, and a lowered amount of the level of the surface of the flux in relation to the movement of the piston based on a detected value of the level of the surface of the flux in the forward end of the interior of the nozzle. Such a configuration enables a suitable setting on the amount of the flux to be supplied or the like to be realized taking into consideration the parts to be mounted on the printed circuit board, a depth of the through-hole and the like.

In this embodiment, the nozzle may includes, at its lower position, a flux-receiving portion boring a discharge hole that discharges the flux and a flux-discharging pipe that connects the discharge hole and a discharged flux accumulation part positioned at a suitable position. This enables any stain generated by the leakage of the flux to be prevented.

According to another embodiment of the invention, there is provided a method of coating flux on a projection of a part mounted on a printed circuit board. The projection passes through a printed circuit board and projects from the printed circuit board. The method contains a printed-circuit-board-holding step of holding the printed circuit board, a flux-supplying step of supplying the flux to a nozzle having an opening through which the projection comes in the nozzle and comes off the nozzle, and a flux-coating step of coating the flux on the projection by dipping at least the projection in the flux contained in the nozzle through the opening.

According to further embodiment of the invention, there is provided a method of coating flux on a projection of a part mounted on a printed circuit board. The projection passes through a printed circuit board and projects from the printed circuit board. The method contains a printed-circuit-board-holding step of holding the printed circuit board, a flux-supplying step of supplying the flux to a nozzle having an opening through which the projection comes in the nozzle and comes off the nozzle, and a flux-pushing step of pushing the flux supplied out of the opening of the nozzle.

In the above-mentioned methods, a level of a surface of the flux contained in the nozzle is lowered after the flux-coating step or the flux-pushing step has finished.

According to the embodiments of the invention, it is possible to provide the apparatus and the method of coating a necessary amount of the flux certainly on the printed circuit board pinpointing at only necessary point(s), without penetrating and leaking the flux.

Specifically, the embodiment of the apparatus of coating the flux according to the invention prevents the solvent from being volatilized, which is different from the foaming typed apparatus of coating the flux. When the flux is coated on only the necessary portion, the apparatus also avoids adhering the flux on the unnecessary portion such as the surface mount board that is mounted on a rear surface, a connector and the like. The apparatus further enables the flux to be coated on the interior of the through-hole surely even if the printed circuit board is the through-hole-printed circuit board, which is difficult to coat the flux thereon formerly.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

DETAILED DESCRIPTION OF THE PREFERRED EMBODIMENTS OF THE INVENTION

Inventors have focused on a fact that the flux can be not only coated on a lead wire of electronic part but also into an interior of the through-hole when it is possible to directly apply the flux to the through-hole without coating the flux by foaming or spraying. They then invent an apparatus and a method of coating the flux, in which by the apparatus of coating the flux, which is provided with a nozzle that is capable of supplying the flux to only a necessary portion and a supplying member that is capable of supplying the flux pinpointing merely by a necessary amount of the flux, the flux can be sufficiently supplied up to the interior of the through-hole if necessary or the minimum flux that is necessary for soldering can be supplied.

The following will describe embodiments of the present invention with reference to the drawings. It is to be noted that the following will describe a case where the projection passing through the printed circuit board P and projecting from the printed circuit board P is one lead wire as the discrete part mounted on the printed circuit board P.

Figure 1:
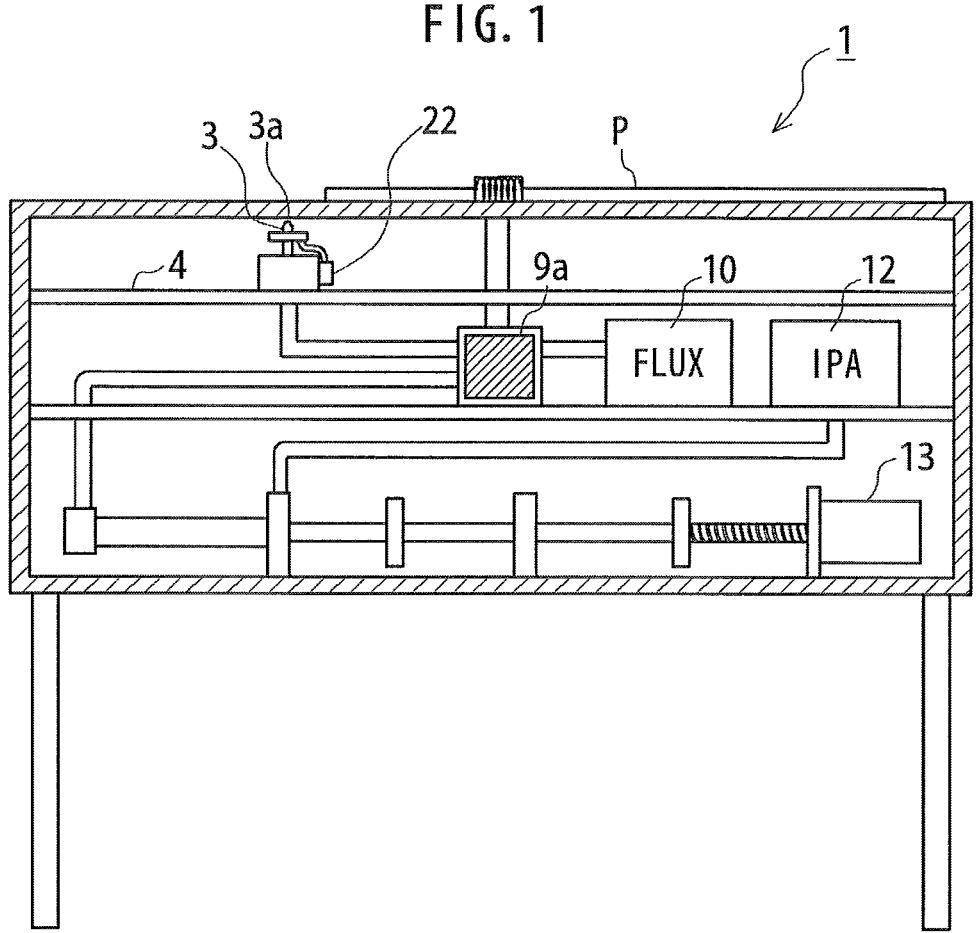
FIG. 1 is a front view of an embodiment of an apparatus of coating flux according to the invention for showing a whole configuration thereof.
Figure 2:
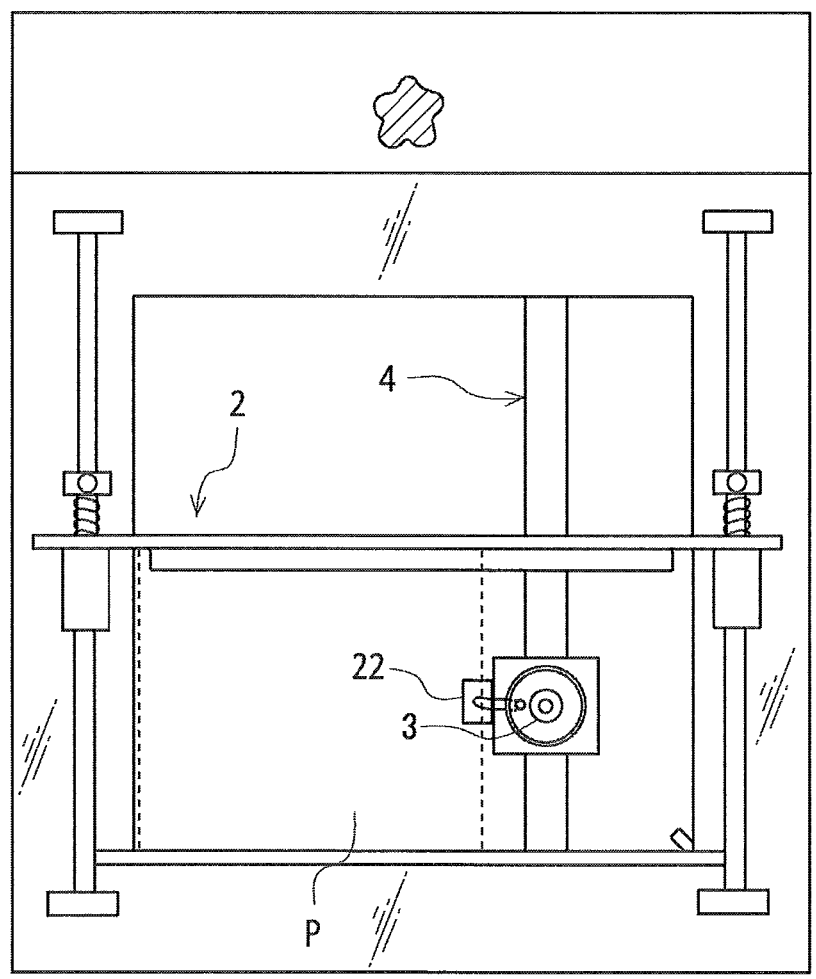
FIG. 2 is a top plan view of the embodiment of the apparatus of coating flux according to the invention for showing a whole configuration thereof.

FIGS. 1 and 2 show the whole configuration of an embodiment of the apparatus 1 of coating the flux according to the invention.

This apparatus 1 of coating the flux contains a printed-circuit-board-holding member 2, a nozzle 3, a nozzle-moving member 4 and a flux-supplying member 5. The following will describe these members successively.

[Printed-Circuit-Board-Holding Member 2]

The printed-circuit-board-holding member 2 holds the printed circuit board P on which the flux is coated to fix the printed circuit board P on a predetermined position at an upper portion of the apparatus 1 of coating the flux. Although the printed-circuit-board-holding member 2 has been described like the above-mentioned member in this embodiment, the printed-circuit-board-holding member 2 is not limited to the above-mentioned member; any member having such a configuration and a function can be used.

[Nozzle 3]

Figure 3:
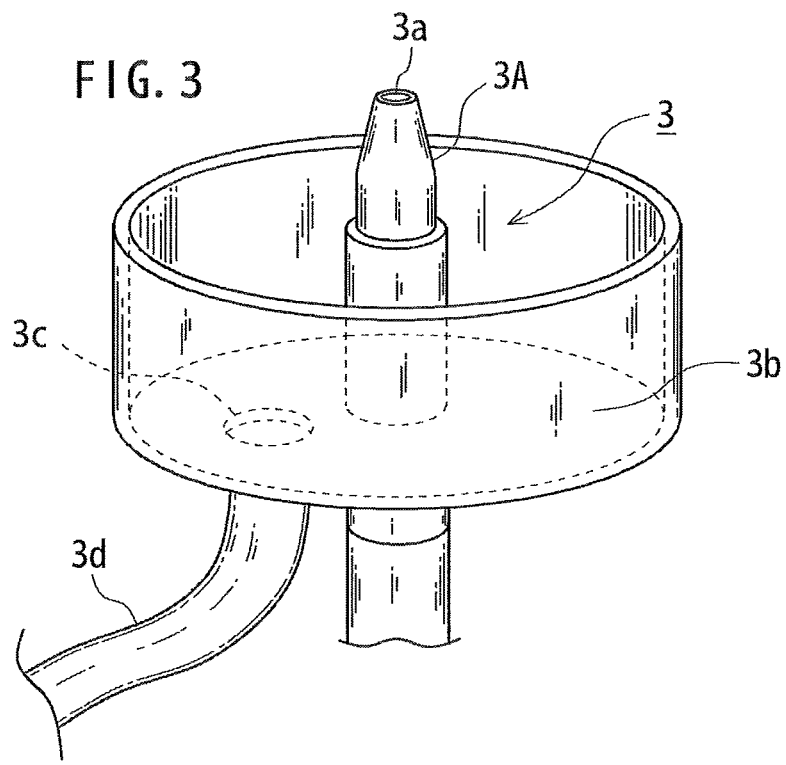
FIG. 3 is an enlarged perspective view of a nozzle.

FIG. 3 shows an enlarged perspective view of the nozzle 3. The nozzle 3 contains a main body made of a hollow pipe and a hollow cone forward end. The nozzle 3 has at its upper end of the main body 3A an opening 3a through which the one lead wire, which passes through the printed circuit board P and projects from the printed circuit board P, of the discrete part mounted on the printed circuit board P comes in the nozzle 3 and comes off the nozzle 3. A bore of the opening 3a of the main body 3A may be suitably changed according to an area and/or a shape of a portion on which the flux is coated or a diameter of the lead wire as the discrete part. Although the main body 3A has the opening 3a of a round shape in this embodiment, the main body 3A suitably can have the opening 3a of a square shape, L-shape or the like. The bore of the opening 3a of the main body 3A may be around 0.3 mm through 20 mm. It is to be noted that the discrete part having the lead wire with a diameter of 0.4 mm is used in this embodiment.

The nozzle 3 is configured so that the nozzle 3 can be moved to three dimension directions using the nozzle-moving member 4, which will be described later, and can stop at a predetermined position.

The nozzle 3 is filled with the flux by the flux-supplying member 5, which will be described, up to an upper portion of the interior of the nozzle 3.

The nozzle 3 includes, at its lower position, a flux-receiving portion 3b boring a discharge hole 3c that discharges the flux and a flux-discharging pipe 3d that connects the discharge hole 3c and a discharged flux accumulation part 22 positioned at a suitable position. The discharged flux accumulation part 22 accumulates a very small amount of the flux received by the flux-receiving portion 3b and passed through the flux-discharging pipe 3d to collect the flux securely.

[Nozzle-Moving Member 4]

The nozzle-moving member 4 supports the nozzle 3 so that the nozzle 3 can be moved to three dimension directions. In other words, the nozzle-moving member 4 positions the nozzle 3 by moving the nozzle 3 to an optional point on the printed circuit board P based on XYZ absolute coordinate system if a plane parallel to a set surface of the printed circuit board P that is immobile is an X-Y plane.

As the nozzle-moving member 4, well-known or common used mechanism therefor may be utilized. In this embodiment, as shown in FIG. 2, an X-Y orthogonal type robot is used for moving the nozzle 3 on the X-Y plane. A motor in which an amount of revolution can be controlled, for example, a servomotor or a stepping (pulse) motor, is used for moving the nozzle 3 on the Z plane. In order to coat the flux on one portion or a plurality of portions on one printed circuit board P, a storing and controlling member, not shown, stores data on position(s) of the X-Y plane, on which the flux is coated to coat the flux based on the data. This enables the flux to be surely coated soon even when coating the flux on a plurality of portions on the printed circuit board P.

[Flux-Supplying Member 5]

The flux-supplying member 5 supplies merely a necessary amount of the flux to the nozzle 3 so that the nozzle 3 is filled with the flux, or preferably, the nozzle 3 is filled with the flux and pushes the flux out of the opening 3a of the nozzle 3.

Figure 4:
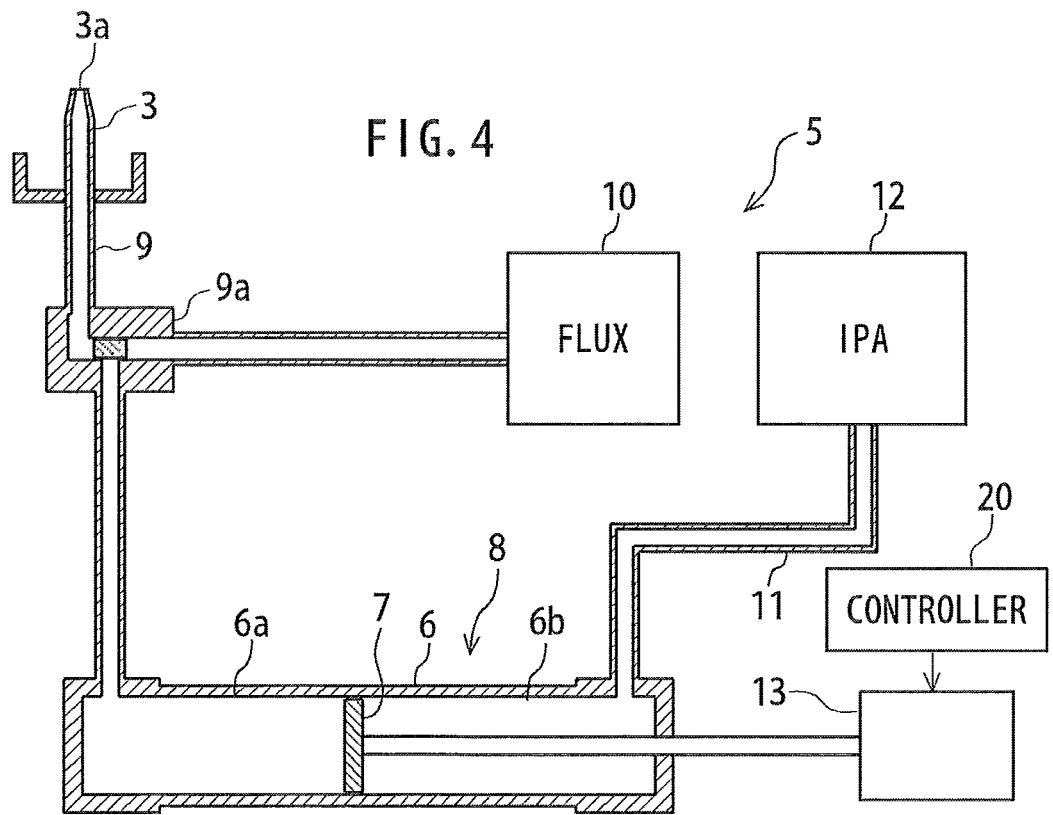
FIG. 4 is a diagram for schematically showing a configuration of a flux-supplying member.
Figure 5:
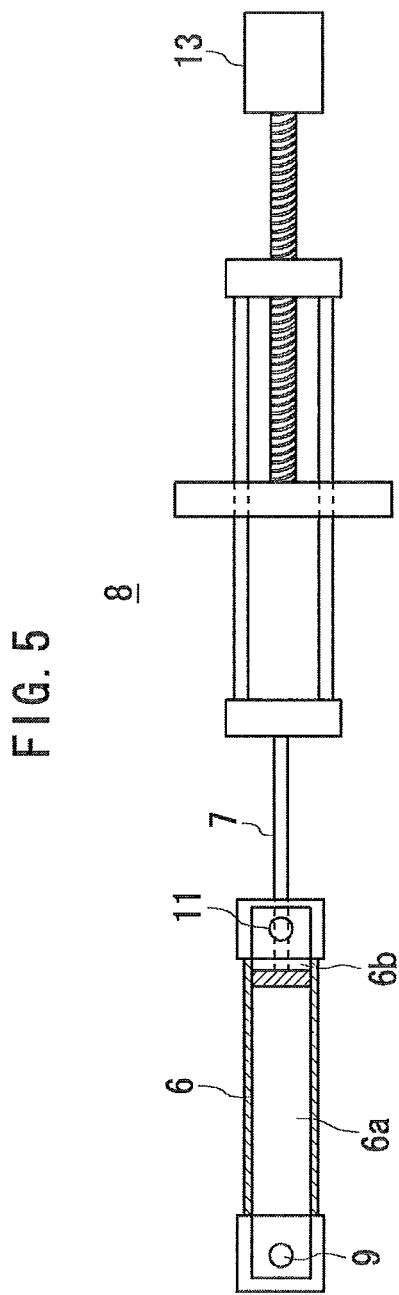
FIG. 5 is a diagram for schematically showing a supply portion shown in FIG. 4.

FIG. 4 schematically shows a configuration of the flux-supplying member 5. FIG. 5 schematically shows a supply portion 8 shown in FIG. 4.

As shown in FIG. 4, the flux-supplying member 5 contains the supply portion 8 that includes a cylinder 6 having a flux-accumulating part 6a which accumulates the flux temporarily and supplies the flux to the nozzle 3 and a solvent-accumulating part 6b which accumulates a solvent. The solvent-accumulating part 6b is provided so as to be adjacent to the flux-accumulating part 6a through a piston 7. The flux-supplying member 5 also contains a flux-storage portion 10 that stores the flux and supplies the flux to the supply portion 8. The flux-supplying member 5 further contains a solvent-storage portion 12 that stores a solvent for preventing the flux from adhering and supplies the solvent to the solvent-accumulating part 6b through a pipe 11. The flux-supplying member 5 additionally contains a controller 20 that controls the supply portion 8, particularly, a motor 13, to supply an amount of the flux to an interior of the nozzle 3. Such a configuration enables an area in which the flux can contact air to be limited to the opening 3a, thereby allowing variation in a density of the flux to be controlled.

As a driving source of the piston 7 of the supply portion 8, the motor 13 in which an amount of revolution can be controlled, for example, a servomotor or a stepping (pulse) motor is preferably used in order to increase accuracy of an amount of the flux to be supplied by the supply portion 8. In this case, preferably, the controller 20 controls a movement of the piston 7 by controlling the driving of such a motor 13 and sets an amount of the flux to be supplied, a period of time when the flux is supplied, and a lowered amount of a level of a surface of the flux in relation to the movement of the piston 7 on the basis of a detected value of the level of the surface of the flux in a forward end of the nozzle 3. When coating the flux on a plurality of positions of the printed circuit board P, it is possible to coat the optimal flux if an amount of the flux to be supplied, a period of time when the flux is supplied, and a lowered amount of a level of a surface of the flux can be set in relation to the movement of the piston 7 that is most suitable to respective portions.

A switching mechanism 9a, for example, a switching valve that switches the supply of the flux from the flux-storage portion 10 to the flux-accumulating part 6a or from the flux-accumulating part 6a to the nozzle 3 is preferably provided at a predetermined position of the pipe 9 connecting the nozzle 3 and the flux-accumulating part 6a.

FIGS. 6 through 10 show, in terms of time, an operation of the supply portion 8 during a period of time from a preparation of supplying the flux by the supply portion 8 to a completion of coating the flux on the discrete parts, at least a lead wire.

Figure 6:
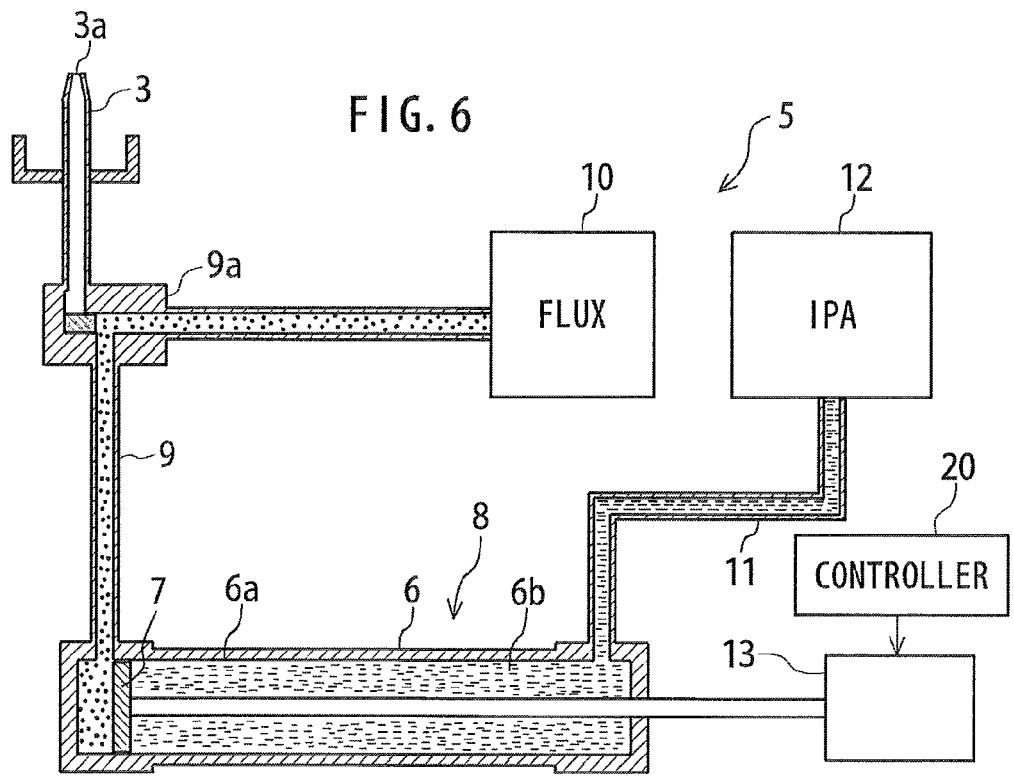
FIG. 6 is a diagram for showing, in terms of time, an operation of the supply portion during a period of time from a preparation of supplying the flux by the supply portion to a completion of coating the flux on a discrete part, at least a lead wire.
Figure 7:
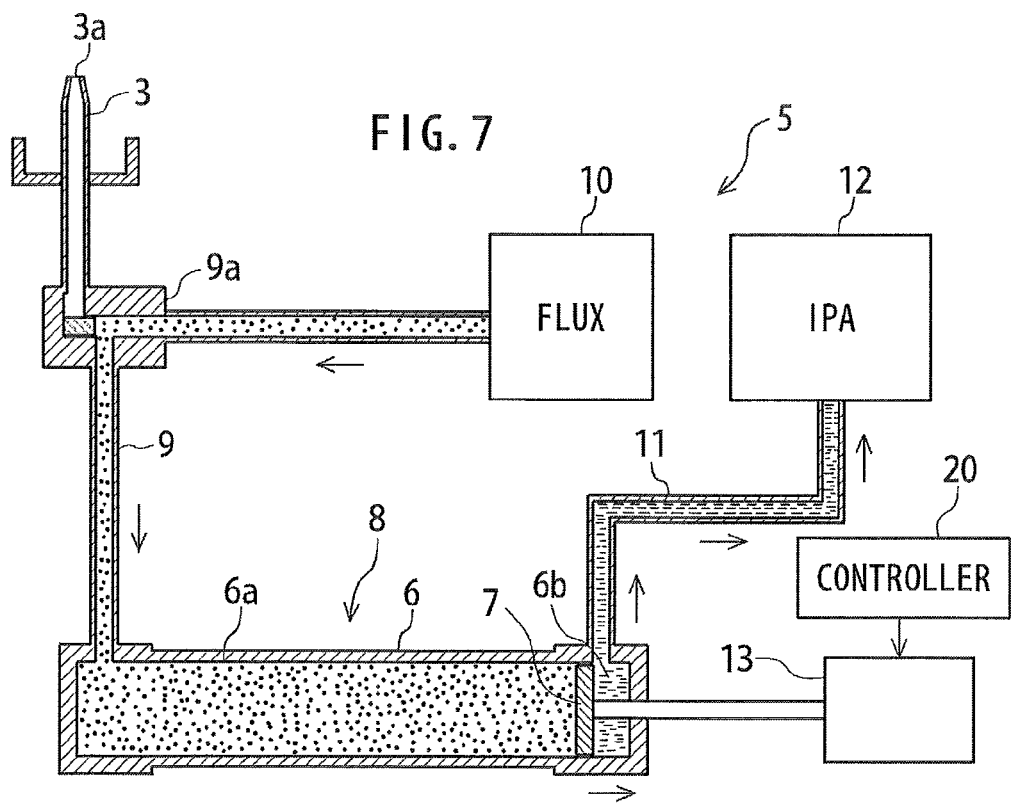
FIG. 7 is a diagram for showing, in terms of time, an operation of the supply portion during a period of time from a preparation of supplying the flux by the supply portion to a completion of coating the flux on a discrete part, at least a lead wire.

As shown in FIGS. 6 and 7, when the switching mechanism 9a switches to move the piston 7 to the right way on the drawings, the flux stored in the flux-storage portion 10 is supplied to the cylinder 6 through the pipe 9 and the solvent for preventing the flux contained in the cylinder 6 from adhering is discharged to the solvent-storage portion 12 through the pipe 11.

Figure 8:
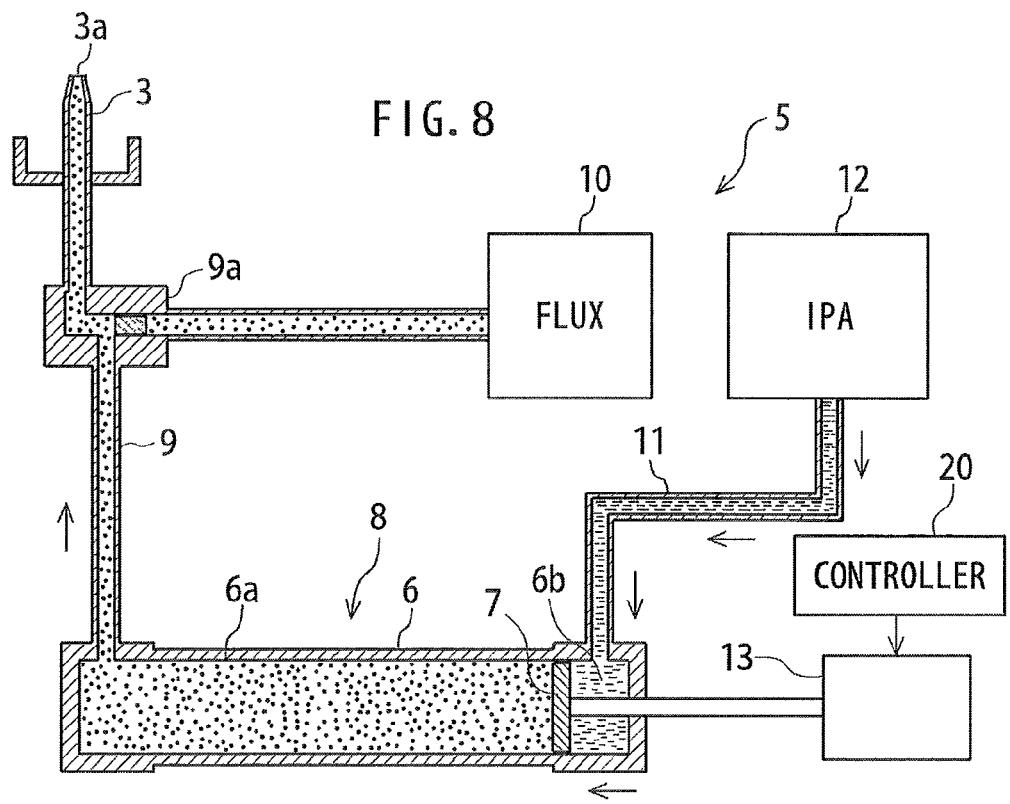
FIG. 8 is a diagram for showing, in terms of time, an operation of the supply portion during a period of time from a preparation of supplying the flux by the supply portion to a completion of coating the flux on a discrete part, at least a lead wire.
Figure 9:
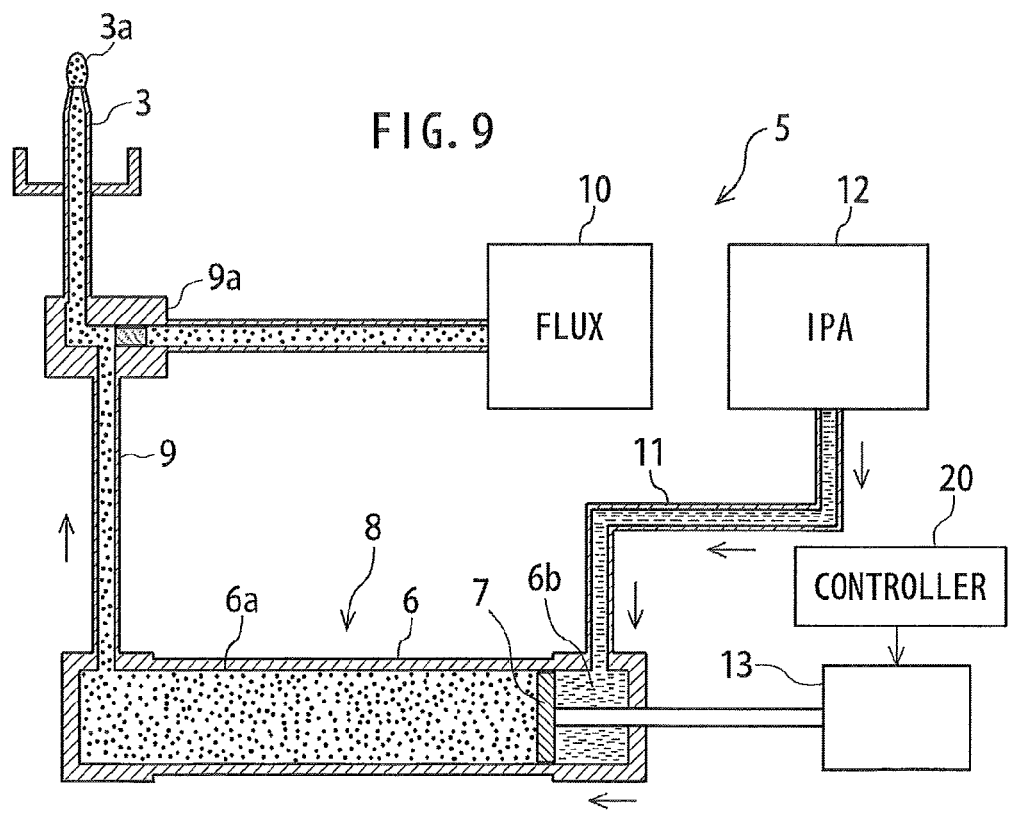
FIG. 9 is a diagram for showing, in terms of time, an operation of the supply portion during a period of time from a preparation of supplying the flux by the supply portion to a completion of coating the flux on a discrete part, at least a lead wire.

As shown in FIGS. 7 and 8, when the switching mechanism 9a switches to move the piston 7 to the left way on the drawings up to a proper quantity, the flux contained in the cylinder 6 is supplied to the nozzle 3 through the pipe 9 by its necessary amount of the flux so that the nozzle 3 is filled with the flux. As shown in FIG. 9, preferably, the flux contained in the cylinder 6 is supplied to the nozzle 3 through the pipe 9 by its necessary amount of the flux so that the nozzle 3 is filled with the flux and the flux is pushed out of the opening 3a of the nozzle 3.

After the nozzle-moving member 4 has previously moved the nozzle 3 to a proper position in regard to a discrete part, the nozzle-moving member 4 lifts the nozzle 3 upwards so that the lead wire of the discrete part can be inserted into the nozzle 3 through the opening 3a thereof, which is not shown in the drawings. This enables the lead wire to be coated.

Figure 11:
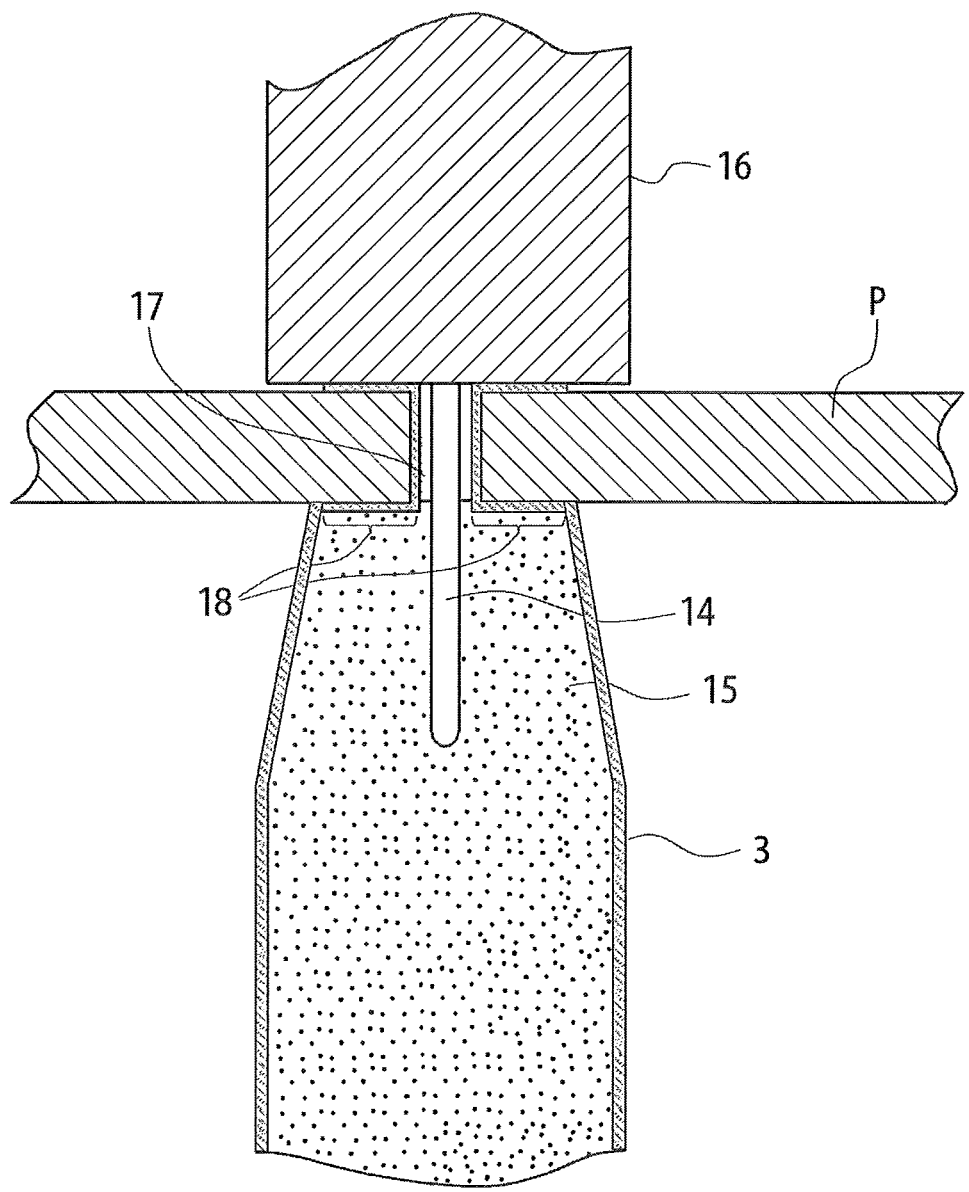
FIG. 11 is a diagram for showing a situation of the lead portion of the discrete part just after the lead portion is dipped in the flux.
Figure 12:
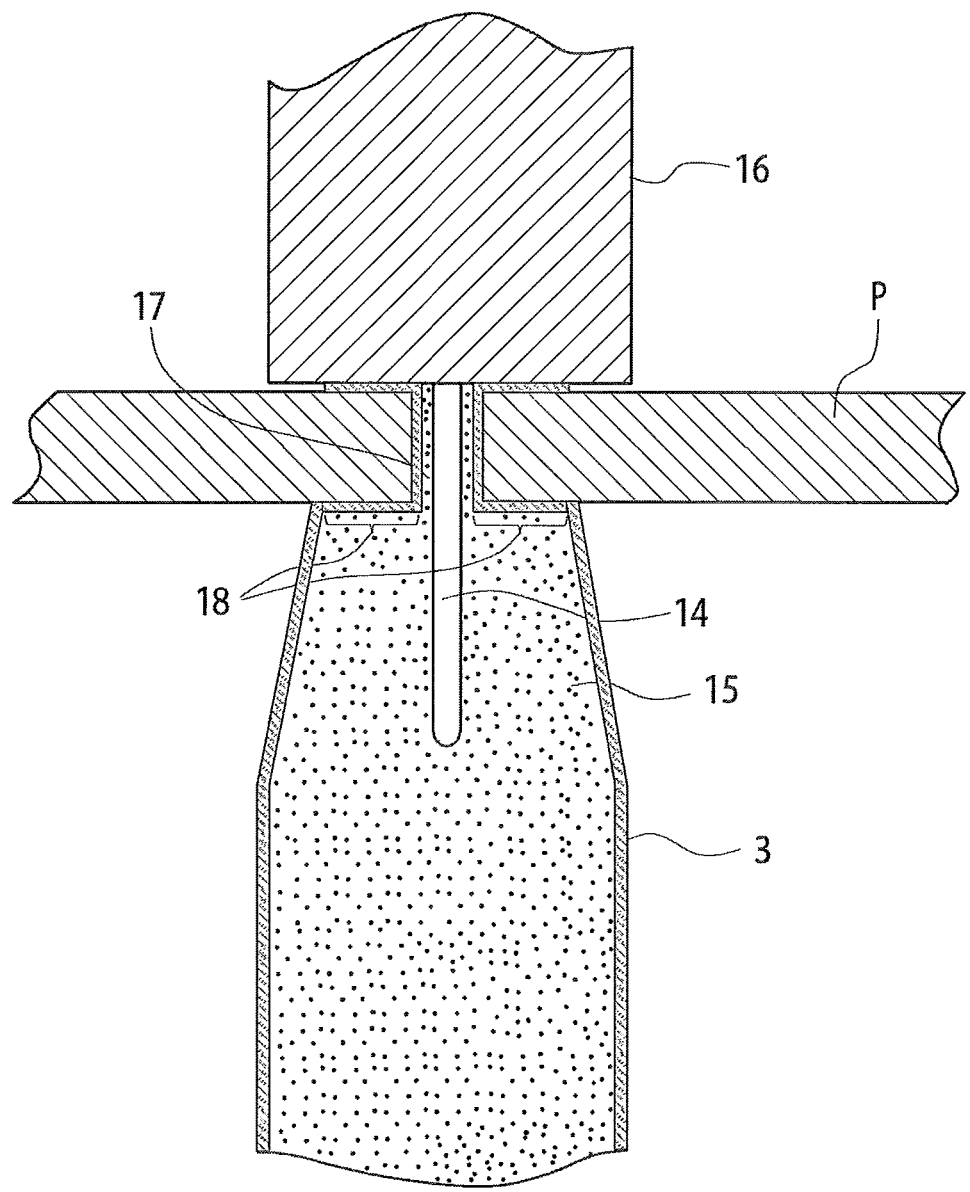
FIG. 12 is a diagram for showing a situation of the lead portion of the discrete part when the dipping finishes.

FIG. 11 shows a situation of the lead wire 14 of the discrete part 16 just after the lead wire 14 is dipped in the flux 15. FIG. 12 shows a situation of the lead wire 14 of the discrete part 16 when the dipping finishes.

As shown in FIGS. 11 and 12, the apparatus 1 of coating the flux according the embodiment of the invention can coat the flux suitably on a whole outer surface of the lead wire 14 and a whole of the interior of the through-hole 17 by capillary phenomenon.

Figure 10:
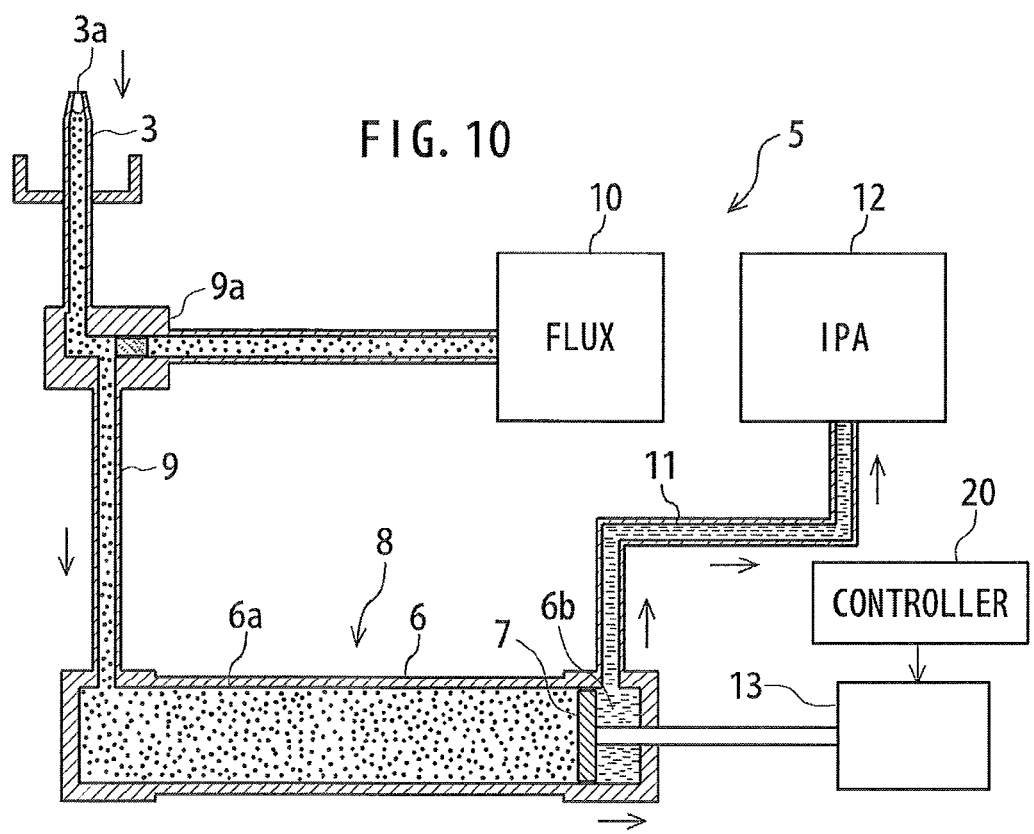
FIG. 10 is a diagram for showing, in terms of time, an operation of the supply portion during a period of time from a preparation of supplying the flux by the supply portion to a completion of coating the flux on a discrete part, at least a lead wire.
Figure 13:
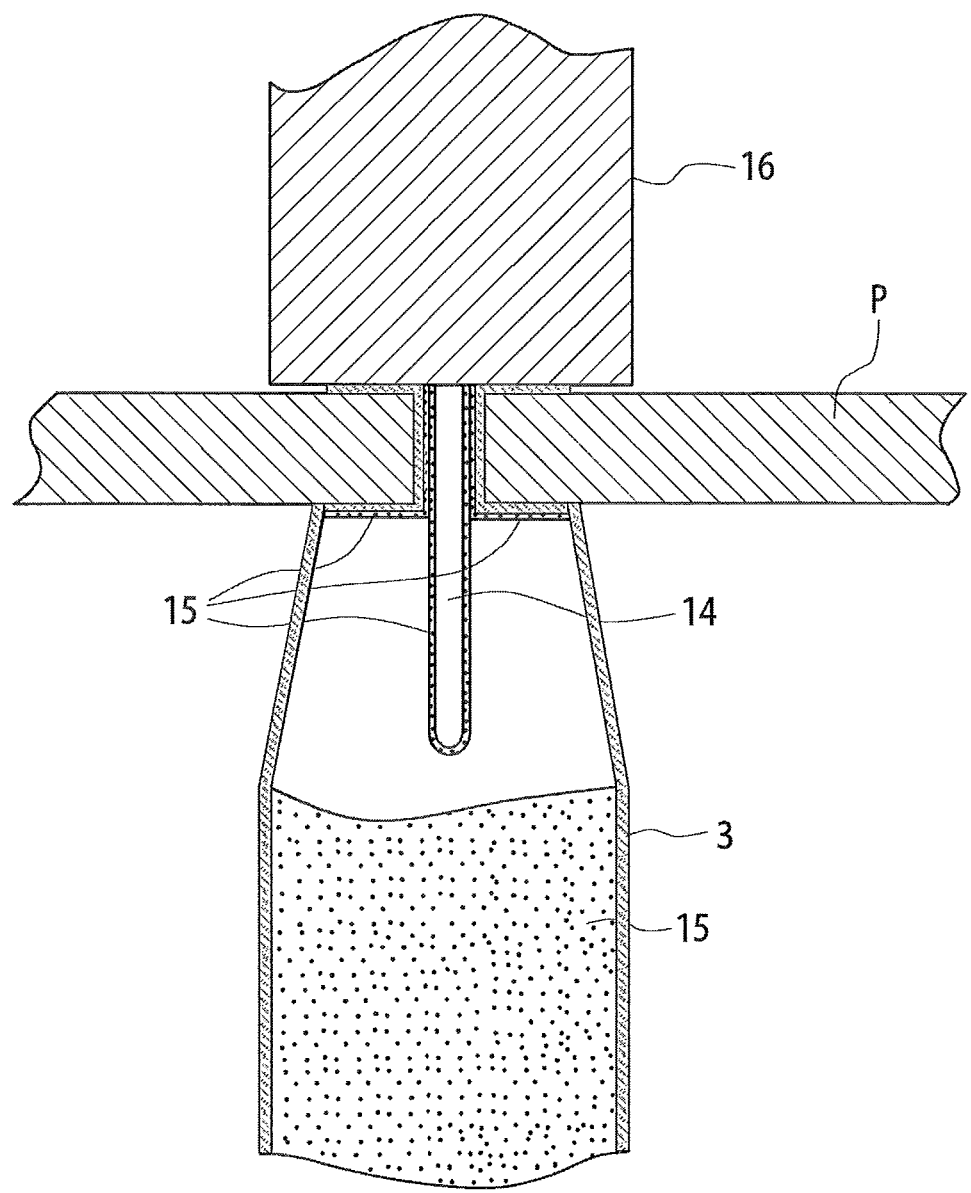
FIG. 13 is a diagram for showing a situation where a level of a surface of the flux filled in the interior of the nozzle is lowered.

As shown in FIG. 10, when the switching mechanism 9a switches to move the piston 7 to the right way on the drawings up to a proper quantity, a level of a surface of the flux filled in the interior of the nozzle 3 is lowered after the flux has been coated on the lead wire 14. This enables any excessive flux adhered to the lead wire 14 and land portion 18 to be removed. FIG. 13 shows a situation where the level of the surface of the flux filled in the interior of the nozzle 3 is lowered. As shown in FIG. 13, the level of the surface of the flux filled in the interior of the nozzle 3 is lowered to a level such that the flux 15 does not contact the lead wire 14. This enables any excessive flux adhered to the lead wire 14 and the land portion 18 to be removed.

Thus, since by suitably controlling an amount of the flux to be supplied to the nozzle 3 with the supply portion 8, the flux can be supplied to the nozzle 3 so that the nozzle 3 is filled with the flux, it is possible to coat the flux on the discrete part, at least lead wire, by passing the lead wire through the opening 3a and dipping it to the flux filled in the interior of the nozzle 3.

On this occasion, by suitably controlling an amount of the flux to be supplied to the nozzle 3 with the supply portion 8, it is possible to lower the level of the surface of the flux filled in the interior of the nozzle 3 after the flux has been coated on the lead wire of the discrete part. This enables any excessive flux adhered on the projection, namely the lead wire, to be removed.

As described above, the apparatus 1 of coating the flux according to the above embodiment of the invention can coat the flux on the projection that passes through the printed circuit board P and projects from the printed circuit board P.

The following will describe a method of coating the flux on a projection of a part mounted on the printed circuit board according to another embodiment of the invention using the apparatus 1 of coating the flux. The projection passes through a printed circuit board and projects from the printed circuit board.

The method includes a printed-circuit-board-holding step of holding the printed circuit board, a flux-supplying step of supplying the flux to a nozzle having an opening through which the projection comes in the nozzle and comes off the nozzle, and a flux-coating step of coating the flux on the projection by dipping at least the projection in the flux contained in the nozzle through the opening. The method may include a flux-pushing step of pushing the supplied flux out of the opening of the nozzle in stead of the flux-coating step.

Further, in these cases, when lowering a level of the surface of the flux filled in the interior of the nozzle 3 after the flux-coating step has been finished, it is possible to remove any excessive flux adhered to the lead wire 14 and/or the land portion 18.

The embodiments of the apparatus and method of coating the flux according to the invention prevent the solvent from being volatilized, which is different from the foaming typed apparatus of coating the flux or when the flux is coated on only the necessary portion. Such apparatus and method also avoid adhering the flux on the unnecessary portion such as the surface mount board that is mounted on a rear surface, a connector and the like. The apparatus and method further enable the flux to be coated on the interior of the through-hole surely even if the printed circuit board is the through-hole-printed circuit board, which is difficult to coat the flux thereon formerly. Thus, according to the above embodiments of the invention, it is possible to provide the apparatus and the method of coating a necessary amount of the flux certainly on the printed circuit board pinpointing at only necessary point (s), without penetrating and leaking the flux by improving the form, spray or dipping type coating.

It should be understood by those skilled in the art that various modifications, combinations, sub-combinations and alternations may occur depending on design requirements and other factors insofar as they are within the scope of the appended claims or the equivalents thereof.

What is claimed is:

1. An apparatus for coating flux on a projection of a part mounted on a printed circuit board, the projection passing through the printed circuit board and projecting from the printed circuit board, the apparatus comprising:
    a printed-circuit-board-holding member that holds the printed circuit board;
    a nozzle having an opening through which the projection is inserted into the nozzle and is withdrawn from the nozzle, such that the flux is coated on at least the projection by dipping the projection in the flux contained in the nozzle through the opening;
    a nozzle-moving member that moves the nozzle to a pre-determined position; and
    a flux-supplying member that supplies the flux to the nozzle,
    wherein the flux-supplying member includes:
    a flux-storage portion that stores the flux;
    a cylinder having a flux-accumulating part which accumulates the flux temporarily and is connectable to the flux-storage portion and to the nozzle;
    a piston located in the cylinder; and
    a driving portion coupled to the piston for driving the piston,
    and wherein the cylinder has a port for supplying flux to and from the flux-accumulating part of the cylinder and the flux-supplying member includes a valve mechanism having a first port connected to the port of the cylinder, a second port connected to the nozzle and a third port connected to the flux-storage portion, the valve mechanism being operative to connect the first port either to the second port or to the third port.

2. The apparatus according to claim 1 wherein the flux-supplying member includes a controller connected to the driving portion for moving the piston to supply flux to the nozzle, for coating on the projection, and to withdraw flux from the nozzle to lower a level of a surface of the flux in an interior of the nozzle after the flux has been coated on the projection.

* * * * *